United States Patent [19]
Ohuchi et al.

[11] Patent Number: 6,097,083
[45] Date of Patent: Aug. 1, 2000

[54] SEMICONDUCTOR DEVICE WHICH IS CRACK RESISTANT

[75] Inventors: Shinji Ohuchi; Etsuo Yamada; Yasushi Shiraishi, all of Tokyo, Japan

[73] Assignee: Oki Electric Industry Co., Ltd., Tokyo, Japan

[21] Appl. No.: 08/827,693

[22] Filed: Apr. 10, 1997

[30] Foreign Application Priority Data

Apr. 10, 1996 [JP] Japan .................................. 8-086968

[51] Int. Cl.[7] ......................... H01L 23/495; H01L 23/48
[52] U.S. Cl. ......................... 257/669; 257/674; 257/735; 257/783; 257/784
[58] Field of Search .................... 257/674, 783, 257/784, 735, 669

[56] References Cited

U.S. PATENT DOCUMENTS

| | | | |
|---|---|---|---|
| 4,864,470 | 9/1989 | Nishio | 361/400 |
| 4,974,057 | 11/1990 | Tazima | 357/72 |
| 5,403,785 | 4/1995 | Arai et al. | 437/220 |
| 5,670,797 | 9/1997 | Okazaki | 257/91 |

FOREIGN PATENT DOCUMENTS

| | | |
|---|---|---|
| 0 587 112 | 6/1994 | European Pat. Off. . |
| 0 651 040 | 5/1995 | European Pat. Off. . |
| 0 657 931 | 6/1995 | European Pat. Off. . |
| 0 710 982 | 5/1996 | European Pat. Off. . |
| 0 750 342 | 12/1996 | European Pat. Off. . |
| 61-218139 | 9/1986 | Japan . |
| 2-125454 | 5/1990 | Japan . |

*Primary Examiner*—Teresa M. Arroyo
*Attorney, Agent, or Firm*—Venable; Robert J. Frank; Allen Wood

[57] ABSTRACT

A resin mold type semiconductor device, which is crack resistant and can be made relatively thin, includes a semiconductor chip, a lead member arranged in a manner such that an one side face of a head portion thereof touches a surface of the semiconductor chip, a wire for electrically connecting the surface of the semiconductor chip and another side face of the lead member, an adhesive member for adhering the one side face of the lead member and a peripheral face of the semiconductor chip, and a package for molding the semiconductor chip, a part of the lead, the wire and the adhesive member by synthetic resin. Further, the lead member may be provided with a concave portion in the one side face and possibly also a groove extending from the concave portion to an end of the lead.

4 Claims, 5 Drawing Sheets

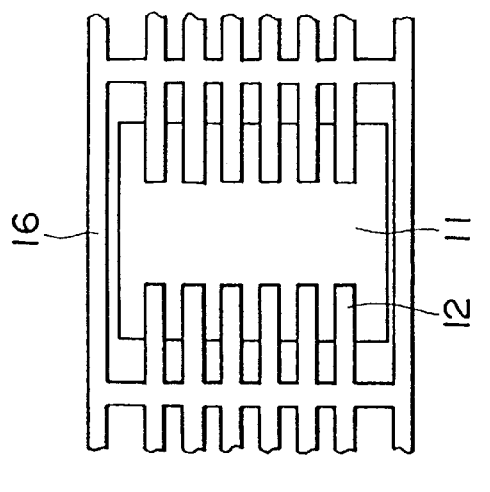
FIG. 2(a)
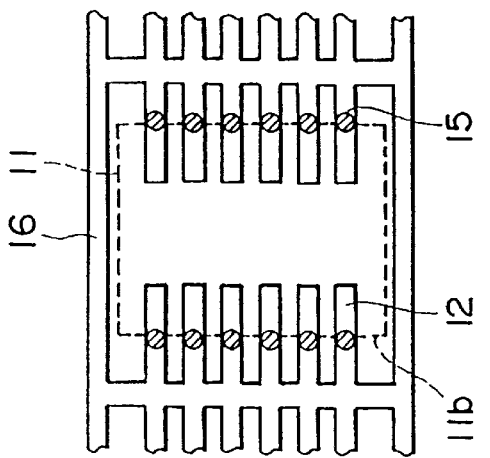
FIG. 2(b)
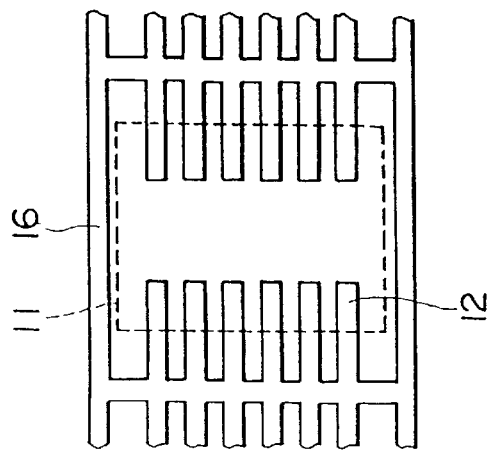
FIG. 2(c)
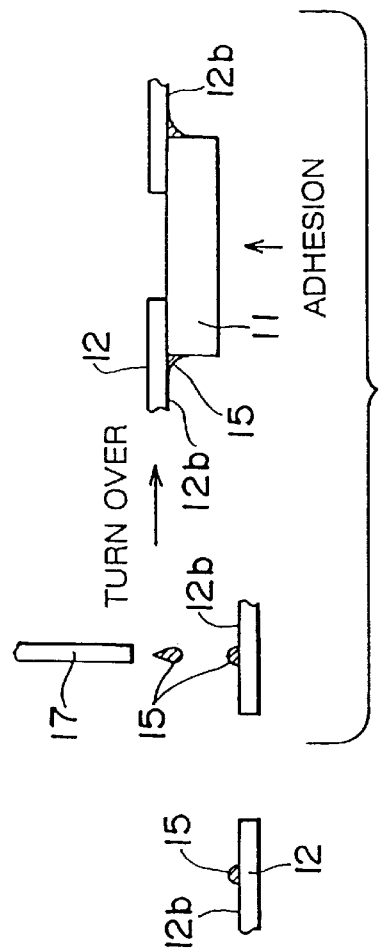
FIG. 2(d)
FIG. 2(e)

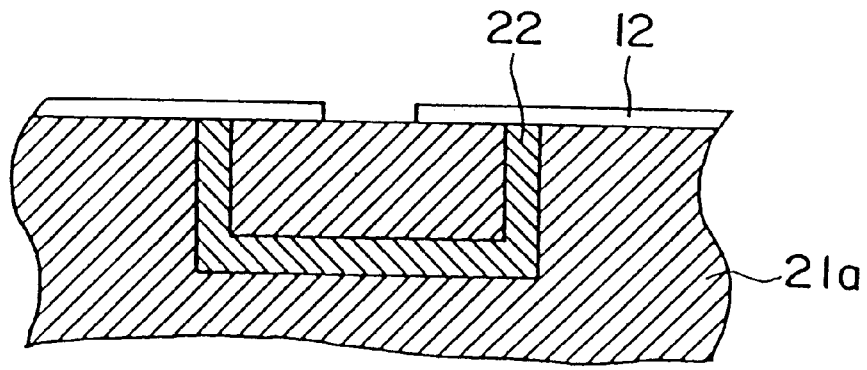
FIG. 3(a)
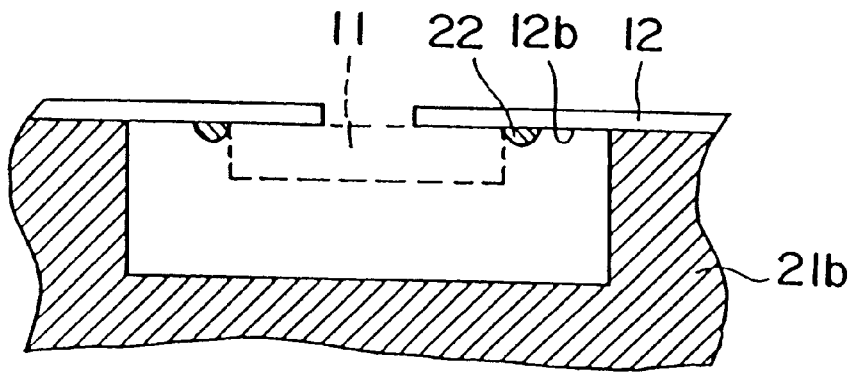
FIG. 3(b)
FIG. 4
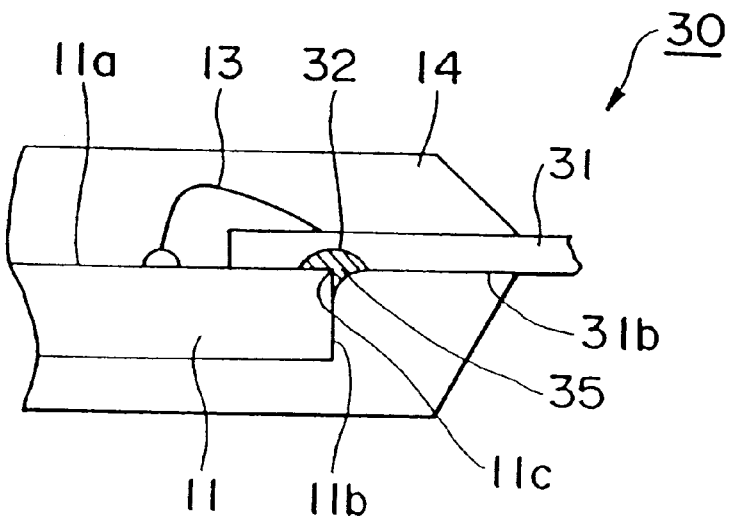

SEMICONDUCTOR DEVICE WHICH IS CRACK RESISTANT

BACKGROUND OF THE INVENTION

1. Field of the Invention

The present invention relates to a semiconductor device and an assembling method thereof, and more particularly relates to a resin mold type semiconductor device and an assembling method thereof, in which a semiconductor chip, parts of leads, wires and so on are molded and encapsulated by synthetic resin.

2. Description of the Related Art

Conventionally, there is a semiconductor device disclosed in Japan Patent Application Laid-Open No. 61-218139 in 1986 or the like.

FIG. 8 is a sectional view of a conventional resin mold type semiconductor device.

As shown in FIG. 8, the resin mold type semiconductor device is provided with a semiconductor chip 1, an insulating tape 2, a lead 3, a metal plate 4, a ball 5, a wire 6 and molded resin 7.

The resin mold type semiconductor device has a LOC (Lead On Chip) structure which the lead 3 is adhered to a surface of the semiconductor chip 1 by the insulating tape 2.

As to a resin mold type semiconductor device like this, the space between a side of a package and the semiconductor chip 1 tends to become narrower as the semiconductor chip (pellet) 1 becomes larger. This is caused by the fact that the package can not made larger, because the size of the package, which stores the semiconductor chip 1, is standardized though the semiconductor chip 1 is made larger.

There is a problem in that a crack 8 may occur in the body of the semiconductor device due to the heat during substrate mounting. Since water is absorbed while the semiconductor device is kept in air and the water is vaporized by the heat during substrate mounting, the force of the vapor causes the crack 8.

Particularly, the insulating tape 2 tends to absorb water, therefore, there are many cases that the crack 8 is caused by the insulating tape 2.

The insulating tape 2 also prevents the semiconductor device from being made thinner.

SUMMARY OF THE INVENTION

Accordingly, it is an object of the present invention to solve the above described problems, and to provide a semiconductor device and an assembling method thereof, which can prevent the semiconductor device from cracking and can make the semiconductor device thinner.

To achieve the above object, a semiconductor device according to the present invention comprises a semiconductor chip; a lead member arranged in a manner that an one side face of a head portion thereof touches a surface of the semiconductor chip; a wire for electrically connecting the surface of the semiconductor chip and another side face of the lead member; an adhesive member for adhering the one side face of the lead member and a peripheral face of the semiconductor chip; and, a package for molding the semiconductor chip, a part of the lead member, the wire and the adhesive member by synthetic resin.

According to the semiconductor device of the present invention, the one side face of the lead member and the peripheral face of the semiconductor chip are adhered by the adhesive member, and therefore, there is no case that the thickness of the semiconductor chip increases by the adhesive member and the semiconductor device can be made thinner.

Moreover, the adhesive member is arranged so as to adhere the peripheral face of the semiconductor chip and the one side face of the lead member, and therefore, the area taken by the adhesive is small. As the result, the adsorption of water can be reduced and a resin crack hardly occurs during substrate mounting.

Another aspect of a semiconductor device comprises a semiconductor chip; a lead arranged in a manner that an one side face of a head portion thereof touches a surface of the semiconductor chip and provided with a concave portion in the one side face; a wire for electrically connecting the surface of the semiconductor chip and another side face of the lead member; an adhesive member for adhering the one side face of the lead member and a corner portion including a part of the surface and a part of the peripheral face of the semiconductor chip; and, a package for molding the semiconductor chip, a part of the lead member, the wire and the adhesive member by synthetic resin.

According to another aspect of the semiconductor device, the concave portion is provided in the lead member and, therefore, the adhesive member is also applied to the concave portion and the lead member is adhered to the corner portion of the semiconductor chip. Thus, the adherent area becomes larger and the adherent strength can be kept. Further, the adhesive member is not forced out.

Further, preferably, the lead member is provided with a groove extending from the concave portion to an end of the lead member.

Since the lead member is provided with the concave portion and the groove like this, the adhesive member is applied to both of the concave portion and the groove. Thus, the corner portion of the semiconductor chip are adhered to the one side face of the lead member. As the result, the adherent area becomes larger, so that the adherent strength can be kept. Further, the adhesive member is not forced out.

To achieve the above object, an assembling method of a semiconductor device according to the present invention comprises (a) a step of determining a amount of adhesive to be applied to a lead member; (b) a step of applying the amount of the adhesive to an one side face of a lead member; (c) a step of adhering the one side face of the lead member and a peripheral face of a semiconductor chip by the adhesive; (d) a step of fixing the lead member and the semiconductor chip by drying the adhesive; (e) a step of electrically connecting the semiconductor chip and the lead member through a wire; and, (f) a step of forming a package by molding the semiconductor chip, the lead member and the wire with synthetic resin.

According to the assembling method of the semiconductor device of the present invention, the determined amount of the adhesive is applied to the one side face of the lead member, and then the one side face of the lead member is adhered to the peripheral face of the semiconductor chip. Thus, a semiconductor device which is thin and has hardly a resin crack can be obtained.

BRIEF DESCRIPTION OF THE DRAWINGS

Other objects and advantages of the present invention will become apparent during the following discussion conjunction with the accompanying drawings, in which:

FIGS. 2(a) through 2(e) are views illustrating an assembling method of a resin mold type semiconductor device according to the present invention;

FIGS. 3(a) and 3(b) are views illustrating another assembling method of a resin mold type semiconductor device according to the present invention;

FIG. 4 is a sectional view illustrating a resin mold type semiconductor device according to the second embodiment of the present invention;

DETAILED DESCRIPTION OF THE PREFERRED EMBODIMENTS

Preferred embodiments of the present invention will now be described with reference to the accompanying drawings.
First Embodiment FIG. 1 is a sectional view illustrating a resin mold type semiconductor device according to the first embodiment of the present invention.

Figure 1:
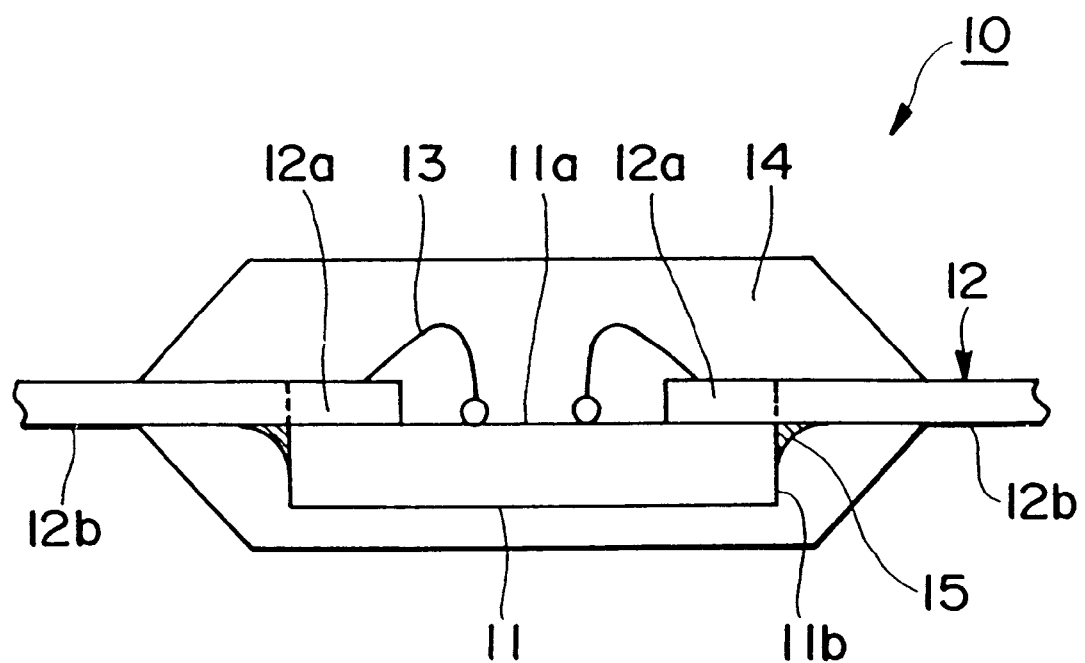
FIG. 1 is a sectional view illustrating a resin mold type semiconductor device according to the first embodiment of the present invention.

As shown in FIG. 1, a resin mold type semiconductor device 10 is provided with a semiconductor chip 11, leads 12, wires 13, a molding resin 14 and adhesive (liquid synthetic resin) 15.

The semiconductor chip 11 is electrically connected with the leads 12 though wires 13. The lead 12 is attached to the semiconductor chip 11 in a manner such that a adhesion side 12b of a head portion 12a thereof touches a surface 11a of the semiconductor chip 11.

Not the surface 11a but a peripheral face 11b of the semiconductor chip 11 is fixed to the adhesion side (one side face) 12b of the lead 12 by the adhesive 15. To fix the semiconductor chip 11 and the lead 12, the adhesive 15 is previously applied to the adhesion side 12b of the lead 12 at a position corresponding to the peripheral face 11b of the semiconductor chip 11, and the semiconductor chip 11 is adhered thereto.

Then, the semiconductor chip 11, the leads 12, the wires 13 and the liquid adhesive resin 15 are molded by the synthetic resin 14 in a manner such that parts of the leads 12 project to the outside, whereby a package is assembled.

According to the first embodiment, the leads 12 and semiconductor chip 11 are adhered and fixed by the adhesive 15 at the peripheral face 11b of the semiconductor chip 11, and therefore, the thickness of the semiconductor device is not increased by adhesive, so that the semiconductor device can be made thinner.

Moreover, the adhesive 15 is applied only to each lead 12, that is, the area which the adhesive 15 is applied is small. Thus, absorption of water can be reduced, so that a crack occurs rarely during substrate mounting.

Next, an explanation will be given of an assembling method of the semiconductor device with reference to FIGS. 2(a) though 2(c).

First, as shown in FIG. 2(a), a lead frame 16 is provided with plural leads 12 touching the surface 11a of the semiconductor chip 11.

As shown in FIGS. 2(d) and 2(e), a predetermined amount of the adhesive 15 is applied to the lead 12 with a dispenser 17 by using pressure. The adhesive 15 is applied to the adhesion side 12b of each lead 12 at a position corresponding to the peripheral face 11b of the semiconductor chip 11. The result is shown in FIG. 2(b). Incidentally, the position, to which the adhesive 15 is applied, may be any position at which the peripheral face 11b of the semiconductor chip 11 is adhered to the adhesion side 12b of the lead 12.

Then, as shown in FIG. 2(c), the lead frame 16 is turned over, and then the semiconductor chip 11 is adhered to the lead 12. The adhesive 15 is dried to fix the semiconductor chip 11 and the lead 12. Thereafter, usual process are performed.

According to this assembling method, a predetermined amount of the liquid adhesive resin 15 is applied to the adhesion side 12b of the leads 12 at positions corresponding to the peripheral face 11b of the semiconductor chip 11, and the adhesion side 12b of the head portion 12a of the leads 12 touches the surface 11a of the semiconductor chip 11. Thus, a semiconductor device is obtained which is thin and crack resistant.

Next, an explanation will be given of another assembling method of the semiconductor device with reference to FIGS. 3(a) and 3(b).

As shown in FIGS. 2(a) through 2(c), the lead frame 16 is provided with plural leads 12 touching the surface 11a of the semiconductor chip 11.

The leads 12 of the lead frame 16, as shown in FIG. 3(a), are passed though an adhesive dipping tank (adhesive applying unit) 21a including adhesive (liquid synthetic resin) 22 in an assembling machine of a semiconductor device so as to apply the adhesive 22 only to needed positions, namely, positions at which the adhesive 22 is touched to the leads 12. In the adhesive dipping tank 21a, application positions of the adhesive 22 can be varied in accordance with the size of the semiconductor chip 11. Then, the predetermined amount of the adhesive 22 is applied to each lead 12 (see FIG. 3(b)).

Then, the lead frame 16, on which the adhesive 22 has been applied, is conveyed to a lead frame keeping tank (keeping unit) 21b. The semiconductor chip 11 is fitted and adhered to the adhesion side 12b of the leads 12 by the adhesive 22 in an adhering unit (not shown). The adhesive 22 is dried, and the semiconductor chip 11 and the leads 12 are fixed in a drying-fixing unit (not shown). Then, the semiconductor chip 11 is electrically connected with the leads 12 through the wires 13 in a connecting unit (not shown), and the semiconductor chip 11, leads 12, wires 13 and the like are resin-molded in a package forming unit (not shown). Thereafter, usual processes are performed.

According to this assembling method, the lead frame 16 is passed though the adhesive dipping tank 21a so as to apply the adhesive 22 to the leads 12, that is, the adhesive 22 is applied to the leads in the state that the adhesion side 12b of the leads 12 faces downward. Thus, it is not necessary to turn over the lead frame 16, so that the semiconductor chip 11 can be adhered to the lead frame 16 smoothly.

Additionally, the adhesive 22 may be any adhesive member which adheres the semiconductor chip 11 and the lead 12.
Second Embodiment Next, an explanation will be given of the second embodiment of the present invention.

Figure 5:
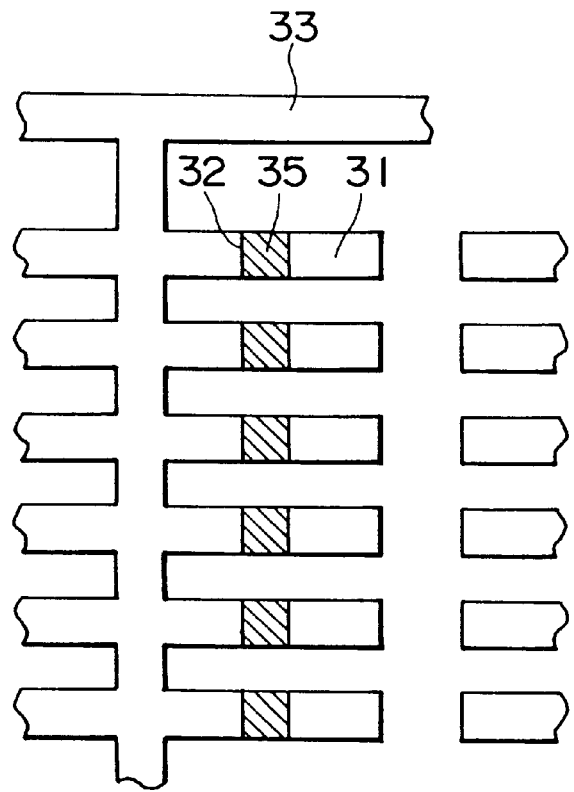
FIG. 5 is a partial plan view illustrating a lead frame of the resin mold type semiconductor device according to the second embodiment of the present invention.

FIG. 4 is a sectional view illustrating a resin mold type semiconductor device according to the second embodiment. FIG. 5 is a partial plan view illustrating a lead frame of the resin mold type semiconductor device.

As shown in FIGS. 4 and 5, a lead 31 of a resin mold type semiconductor device 30 is provided with a concave portion 32 in a adhesion side (one side face) 31b thereof. The concave portion 32 is formed by half-etching, that is, the lead 31 is etched to the half of the thickness thereof by a solution or the like. Incidentally, the concave portion 32 may be formed into any form and by any method.

The semiconductor chip 11 and the lead 31 of the lead frame 33 are arranged in a manner such that a head portion of the lead 31 touches the surface 11a of the semiconductor chip 11, and are electrically connected through the wire 13, similarly to the resin mold type semiconductor device 10.

The vicinity of a corner 11c of the semiconductor chip 11 is fixed to a adhesion side 31b of the lead 31 by adhesive 35. That is, the vicinity of the corner 11c includes a part of the surface 11a and a part of the peripheral face 11b of the semiconductor chip 11.

When the resin mold type semiconductor device is assembled, the adhesive 35 has previously been applied to the adhesion side 31b of the leads 31 at positions corresponding to the peripheral face 11b of the semiconductor chip 11. At this time, a part of the applied adhesive 35 enters the concave portion 32, and when the vicinity of the corner 11c of the semiconductor chip 11 is adhered to the adhesion side 31b of the leads 31 by the adhesive 35.

Then, the semiconductor chip 11, the leads 31, the wires 13 and the adhesive 35 are molded by the synthetic resin 14 in a manner that parts of the leads 31 project to the outside, whereby a package is assembled.

According to the resin mold type semiconductor device 30 of the second embodiment, the vicinity of the corner 11c of the semiconductor chip 11 is adhered to the adhesion side 31b of the lead 31 by the adhesive 35, and therefore, the adherent area becomes larger, so that the adherent strength can be kept.

Moreover, the concave portion 32 is formed in the lead 31, and therefore even if the adhesive 35 is applied in more than the predetermined amount, an excess of the adhesive 35 enters the concave portion 32 so as not to be forced out.

Third Embodiment

Next, an explanation will be given of the third embodiment of the present invention.

Figure 6:
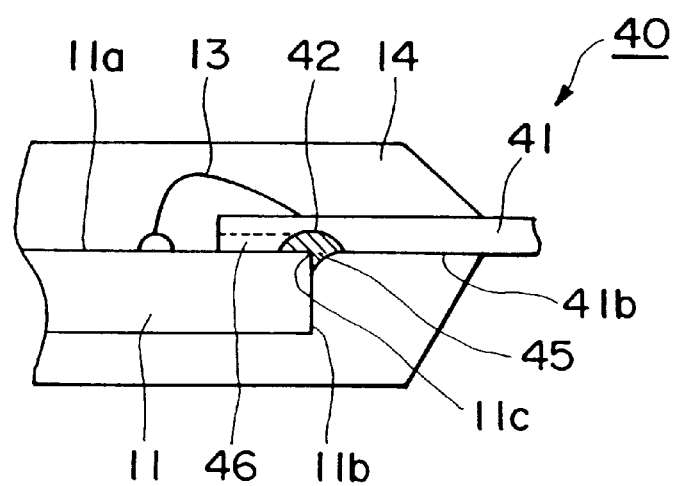
FIG. 6 is a sectional view illustrating a resin mold type semiconductor device according to the third embodiment of the present invention.
Figure 7:
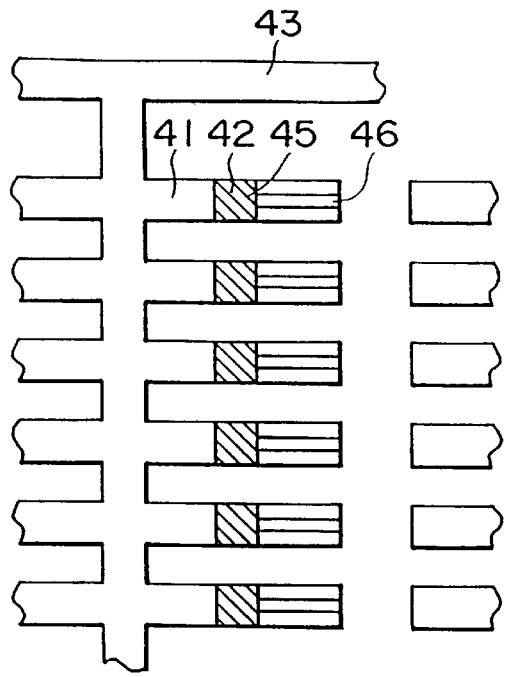
FIG. 7 is a partial plan view illustrating a lead frame of the resin mold type semiconductor device according to the third embodiment of the present invention.
Figure 8:
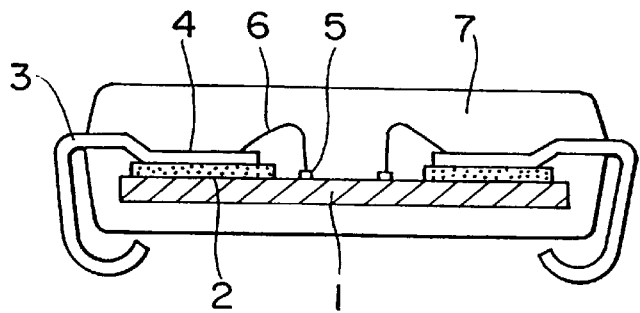
FIG. 8 is a sectional view of a conventional resin mold type semiconductor device; and, FIG. 9 is a sectional view showing problems concerning the conventional technique.
Figure 9:
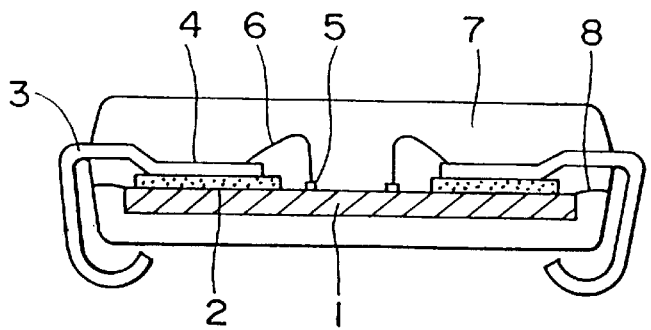

FIG. 6 is a sectional view illustrating a resin mold type semiconductor device according to the third embodiment. FIG. 7 is a partial plan view illustrating a lead frame of the resin mold type semiconductor device.

As shown in FIGS. 6 and 7, a lead 41 of a resin mold type semiconductor device 40 is provided with a concave portion 42 and a groove 46 extending from the concave portion 42 to the end portion of each lead 41 in a adhesion side (one side face) 41b thereof. The concave portion 42 and the groove 46 are formed by half-etching, that is, the lead 41 is etched to the half of the thickness thereof by a solution or the like. Incidentally, the concave portion 42 and the groove 46 may be formed into any form and by any method.

The semiconductor chip 11 and the lead 41 of the lead frame 43 are arranged in a manner such that a head portion of the lead 41 touches the surface 11a of the semiconductor chip 11, and are electrically connected through the wire 13, similarly to the resin mold type semiconductor devices 10, 30.

The vicinity of a corner 11c of the semiconductor chip 11 is fixed to a adhesion side 41b of the lead 41 by adhesive 45. The vicinity of a corner 11c includes a part of surface 11a and a part of peripheral face 11b of the semiconductor chip 11.

When the resin mold type semiconductor device 40 is assembled, the adhesive 45 has previously been applied to the adhesion side 41b of the leads 41 at positions corresponding to the peripheral face 11b of the semiconductor chip 11. At this time, a part of the applied adhesive 45 enters the concave portion 42 and the groove 46, and then the vicinity of the corner 11c of the semiconductor chip 11 is adhered to the adhesion side 41b of the leads 41 by the adhesive 45.

Then, the semiconductor chip 11, the leads 41, the wires 13 and the adhesive 45 are molded by the synthetic resin 14 in a manner that parts of the leads 44 project to the outside, whereby a package is assembled.

According to the resin mold type semiconductor device 40 of the third embodiment, the vicinity of the corner 11c of the semiconductor chip 11 is adhered to the adhesion side 41b of the lead 41 by the adhesive 45, and therefore, the adherent area becomes larger, so that the adherent strength can be kept.

Moreover, the concave portion 42 and the groove 46 are formed in the lead 41, and therefore, even if the adhesive 45 is applied in more than the predetermined amount, an excess of the adhesive 45 enters the concave portion 42 and the groove 46 so as not to be forced out.

As explained in detail, according to the resin mold type semiconductor device of the present invention, the following effects can be achieved.

Leads and a semiconductor chip are fixed by adhesive at peripheral faces of the semiconductor chip, therefore, the thickness of the semiconductor device is not increases by adhesive, so that the semiconductor device can be made thinner.

Moreover, adhesive is applied to only each lead, and therefore, the area taken by the adhesive is small. As the result, absorption of water can be reduced, whereby a resin crack rarely occurs during substrate mounting.

A predetermined amount of adhesive is applied to a surface of a lead at a position corresponding to a peripheral face of a semiconductor chip by pressure, and the semiconductor chip is adhered thereto, and therefore, a resin mold type semiconductor device which is thin and crack resistant can be obtained.

Adhesive is applied to a lead by passing a lead frame through a adhesive dipping tank in a state such that the adhesion side of the lead faces downward, and therefore, it is not necessary to turn over the lead frame, so that a semiconductor chip can be adhered to the lead frame smoothly.

The leads and the semiconductor chip are fixed by the adhesive in the vicinity of the corner of the semiconductor chip, and therefore, the adherent area becomes larger and the strength can be kept.

Moreover, a concave portion is provided in the lead, and therefore, the adhesive is not forced out.

This invention being thus described, it will be apparent that same may be varied in various ways. Such variations are not to be regarded as departures from the spirit and scope of the invention, and all such modifications as would be apparent for one skilled in the art are intended to be included within the scope of the following claims.

What is claimed is:

1. A semiconductor device comprising:
   a semiconductor chip;
   a lead member arranged so that one side face of a head portion thereof touches a surface of the semiconductor chip;
   a wire for electrically connecting the surface of the semiconductor chip and another side face of the lead member;

an adhesive member for adhering the one side face of the lead member to a peripheral face of the semiconductor chip; and a package for molding the semiconductor chip, a part of the lead member, the wire and the adhesive member by synthetic resin.

2. A semiconductor device according to the claim 1, wherein said adhesive member is a solidified member of liquid synthetic resin.

3. A semiconductor device comprising:

a semiconductor chip;

a lead member arranged so that one side face of a head portion thereof touches a surface of the semiconductor chip, the lead member being provided with a concave portion in the one side face;

a wire for electrically connecting the surface of the semiconductor chip and another side face of the lead member;

an adhesive member for adhering the one side face of the lead member to a comer portion of the semiconductor chip, the comer portion including a part of the surface and a part of a peripheral face of the semiconductor chip; and a package for molding the semiconductor chip, a part of the lead member, the wire and the adhesive member by synthetic resin.

4. A semiconductor device according to the claim 3, wherein said lead member is provided with a groove extending from the concave portion to an end of the lead member.

* * * * *